(12) United States Patent
Kinsman et al.

(10) Patent No.: US 6,246,110 B1
(45) Date of Patent: Jun. 12, 2001

(54) DOWNSET LEAD FRAME FOR SEMICONDUCTOR PACKAGES

(75) Inventors: Larry D. Kinsman, Boise, ID (US); Mark Wolfe, Irving, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/415,739

(22) Filed: Oct. 12, 1999

Related U.S. Application Data

(62) Division of application No. 09/110,235, filed on Jul. 6, 1998, now Pat. No. 6,075,283.

(51) Int. Cl.$^7$ .......................... H01L 23/495; H01L 23/48; H01L 23/14
(52) U.S. Cl. .......................... 257/672; 257/676; 257/671; 257/670; 257/666
(58) Field of Search .................................... 257/666, 670, 257/671, 672, 676, 696, 698, 692, 690

(56) References Cited

U.S. PATENT DOCUMENTS

| | | |
|---|---|---|
| 4,791,473 | 12/1988 | Phy . |
| 5,150,194 | 9/1992 | Brooks et al. . |
| 5,214,307 | 5/1993 | Davis . |
| 5,218,229 | 6/1993 | Farnworth . |
| 5,512,781 | 4/1996 | Inoue . |
| 5,539,251 | 7/1996 | Iverson et al. . |
| 5,594,234 | 1/1997 | Carter, Jr. et al. . |
| 5,623,162 | 4/1997 | Kurihara . |
| 5,656,855 * | 8/1997 | Fukase et al. ................... 257/672 |
| 5,703,396 | 12/1997 | Kurihara . |
| 5,708,293 | 1/1998 | Ochi et al. . |
| 5,710,064 | 1/1998 | Song et al. . |
| 5,719,435 * | 2/1998 | Davis et al. ................... 257/666 |
| 5,763,945 | 6/1998 | Corisis et al. . |
| 5,811,875 * | 9/1998 | Jeong et al. ................... 257/672 |
| 5,889,318 | 3/1999 | Corisis . |
| 5,903,048 | 5/1999 | Bandou et al. . |
| 5,914,529 * | 6/1999 | King et al. ................... 257/672 |
| 5,930,602 | 7/1999 | Kinsman . |
| 5,932,924 | 8/1999 | Diana et al. . |
| 5,939,777 | 8/1999 | Zuniga . |
| 5,945,731 | 8/1999 | Iino . |
| 6,075,283 | 6/2000 | Kinsman et al. . |

* cited by examiner

Primary Examiner—Alexander O. Williams
(74) Attorney, Agent, or Firm—Stephen A. Gratton

(57) ABSTRACT

A semiconductor lead frame, and a semiconductor package fabricated using the lead frame, are provided. The lead frame includes side rails; patterns of lead fingers; and multiple die mounting paddles. Each die mounting paddle is configured to mount a semiconductor die for wire bonding to an associated pattern of lead fingers. In addition, each die mounting paddle includes support members on opposing sides, each having at least two downset segments. The downset segments of the support members offset the die mounting paddles from the lead fingers. In a first lead frame embodiment, the support members include downset segments oriented at opposing angles with respect to a longitudinal axes of the mounting paddles. In a second embodiment, the support members include two or more downset segments oriented along axes that are generally parallel to the die mounting paddles.

18 Claims, 4 Drawing Sheets

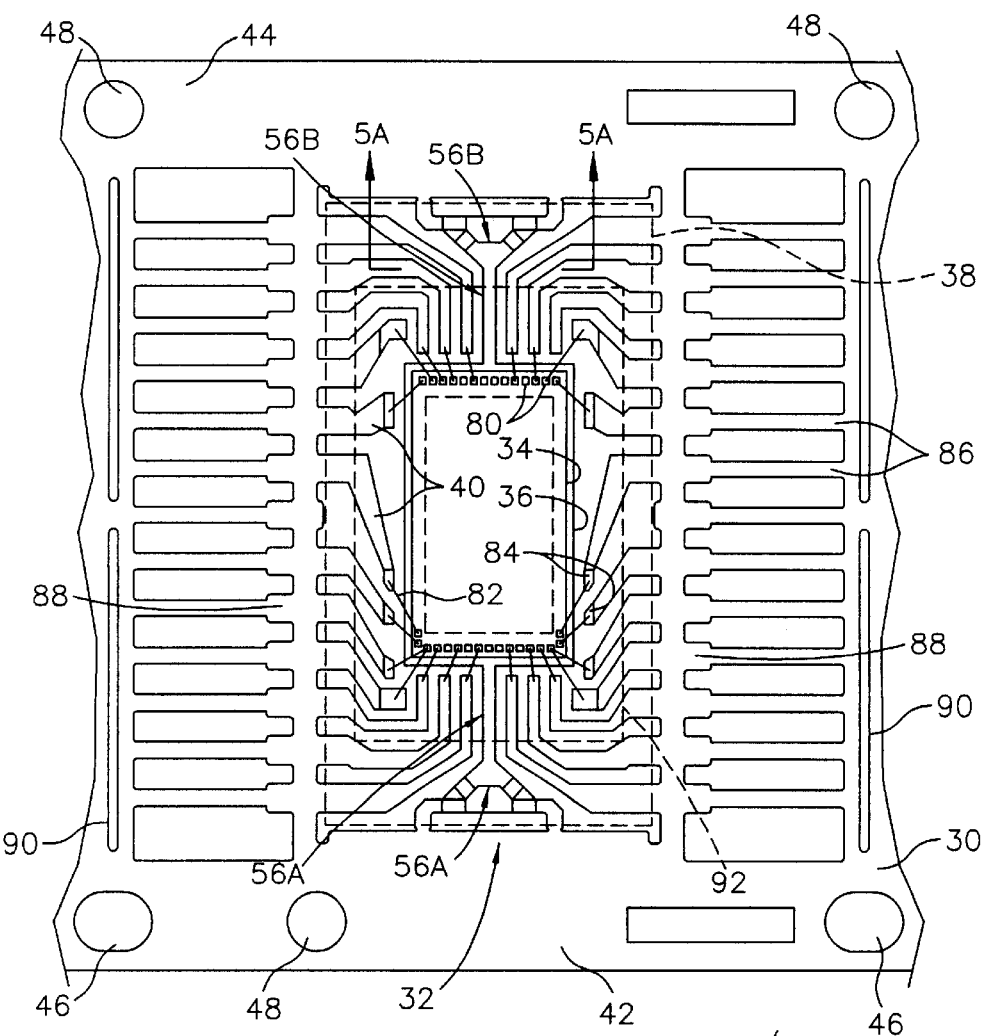
FIGURE 5
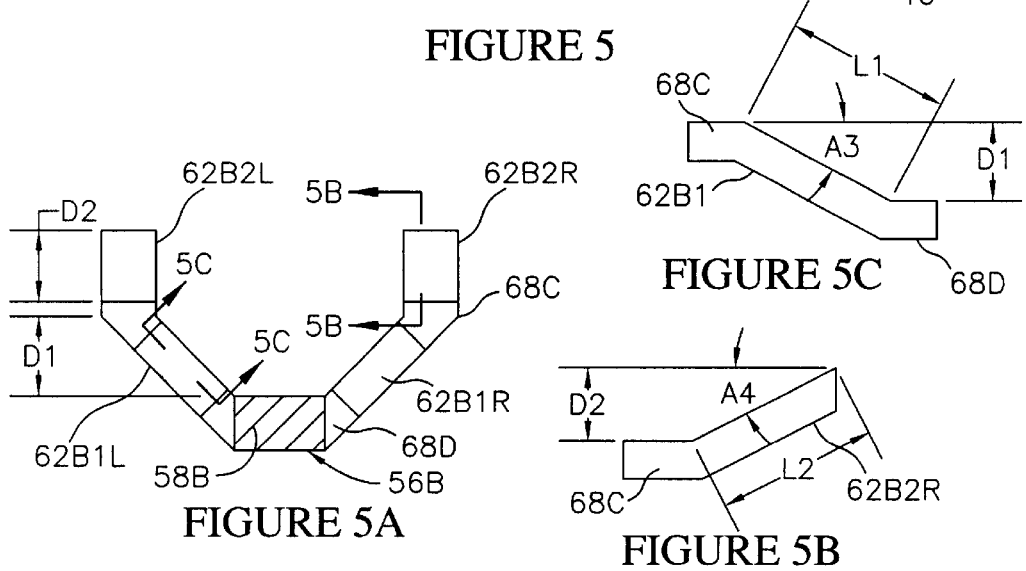
FIGURE 5A
FIGURE 5B
FIGURE 5C

DOWNSET LEAD FRAME FOR SEMICONDUCTOR PACKAGES

CROSS REFERENCE TO RELATED APPLICATIONS

This application is a division of application Ser. No. 09/110,235 filed Jul. 6, 1998, now U.S. Pat. No. 6,075,283.

FIELD OF THE INVENTION

This invention relates generally to semiconductor packaging, and specifically to an improved downset lead frame for semiconductor packages.

BACKGROUND OF THE INVENTION

Plastic semiconductor packages are fabricated using lead frames. A conventional plastic package includes a semiconductor die attached to a lead frame, and encapsulated in a plastic body. The lead frame supports the die during a molding process, and provides the internal traces and terminal leads of the completed package. Typically, the lead frame comprises a stamped or etched metal, such as a nickel-iron alloy, or a copper based alloy. Lead frames are provided in strips adapted to form multiple packages, which are subsequently singulated into individual packages.

One type of lead frame includes mounting paddles for the dice, and patterns of lead fingers spaced around the peripheries of the mounting paddles. Prior to the molding process, the backsides of the dice can be attached to the mounting paddles using an adhesive. In addition, metal wires can be wire bonded to the lead fingers, and to bond pads on the faces of the dice. Using a transfer molding process, a plastic material, such as an epoxy resin, is molded to either side of the dice and lead frame, and over the wire bonded wires. The lead frame is then singulated into multiple packages, and the lead fingers are trimmed and shaped to form the terminal leads of the packages.

One approach to fabricating a plastic semiconductor package involves providing the lead frame with a mounting paddle that is recessed from a center line of the package. This type of semiconductor package 10 is illustrated in FIGS. 1A–1C. In FIG. 1A, the package 10 includes a semiconductor die 12 and a lead frame 14. A backside of the die 12 is attached to a mounting paddle 18 of the lead frame 14. In addition, wires 16 are bonded to bond pads on the die 12, and to lead fingers of the lead frame 14. For simplicity the lead fingers are not shown in FIGS. 1A–1C. However, the lead fingers are spaced around a periphery of the mounting paddle 18, in a plane coincident to a major plane of the lead frame 14. The package 10 also includes a plastic body 20 molded to either side of the die 12 and lead frame 14.

To minimize thermal stresses resulting from a TCE mismatch between the plastic body 20, and the lead frame 14, it is preferable to locate the lead frame 14 along a center line 22, or neutral bend axis, of the package 10. The center line 22 is also coincident to a major plane of the lead frame 14. To improve the wire bonding process, it is also desirable to locate the die 12 below this center line 14. This reduces drag forces on the wires 16 during wire bonding, and allows the wires to be more easily encapsulated by the plastic body. In order to satisfy these requirements, and properly locate the die 12 with respect to the lead frame 14, the mounting paddle 18 can be offset from the center line 22 of the package 10. A downset 24 can be provided on the lead frame 14 to recess the mounting paddle 18 below the center line 22 of the package 10. As shown in FIG. 1B, the downset 24 has a length "L" and a depth "D". The depth "D" is equal to an offset of the die 12 below the center line 22 of the package 10. As used herein the term "downset" refers to a stepped portion of a lead frame, that provides an offset for a first portion of the lead frame relative to a second portion of the lead frame. Typically, the downset provides an offset for a mounting paddle, or other die mounting portion of the lead frame relative to lead fingers on the lead frame.

Some recent package designs require a relatively large offset for the die 12 and thus relatively large downsets 24. For example, a depth "D" of the downsets 24 can be from 7 mils to 14 mils. One problem with this construction is that the planarity of the mounting paddles 18 can be effected. As shown in FIG. 1C, the mounting paddle 18 is in effect suspended from the downsets 24. Any differences in the depth "D" of the downsets 24, or in the parallelism or locations of the downsets 24, can cause the mounting paddle 18 to be angled with respect to the lead frame 14.

Another problem with large downsets 24 is that the lead frames 14 are often stacked for handling. The large downsets 24 can cause the lead frames 14 to interlock and become difficult to separate. Also, lead frames 14 that are fabricated by stamping can include downsets 24 which require overworking and work hardening of the metal which forms the downsets. This can cause cracks and weak spots in the downsets 24.

In view of the foregoing deficiencies in lead frames, the present invention is directed to an improved downset lead frame and to an improved method for fabricating semiconductor packages using the downset lead frame.

SUMMARY OF THE INVENTION

In accordance with the present invention, an improved downset lead frame, and a method for fabricating semiconductor packages using the lead frame, are provided. The lead frame includes spaced side rails and multiple patterns of lead fingers. The lead frame also includes multiple die mounting paddles attached to the side rails by support members. The support members include multiple downset segments configured to offset the die mounting paddles from the lead fingers.

In a first lead frame embodiment, each support member includes at least one mating pair of mating downset segments oriented at opposing angles relative to a longitudinal axis of an associated die mounting paddle. In a second lead frame embodiment, the support members include at least one pair of mating downset segments oriented along axes that are parallel to a longitudinal axis of an associated die mounting paddle.

In either embodiment the construction and orientation of the downset segments provide improved x, y and rotational orientation of the die mounting paddles. In addition, the construction and orientation of the downset segments improves the stacking of multiple lead frames, and the alignment of adjacent lead frames in a stack. Still further, the multiple downset segments can be formed without excessively work hardening of the lead frame metal, as can occur with large offset downset segments.

BRIEF DESCRIPTION OF THE DRAWINGS

FIG. 5 is an enlarged portion of FIG. 2 taken along section line 5—5 illustrating a semiconductor package on the downset lead frame with parts removed prior to singulation of the package from the lead frame;

FIG. 5A is a cross sectional view taken along section line 5A—5A of FIG. 5;

FIG. 5B is an enlarged cross sectional view taken along section line 5B—5B of FIG. 5A; and FIG. 5C is an enlarged cross sectional view taken along section line 5C—5C of FIG. 5A.

DETAILED DESCRIPTION OF THE PREFERRED EMBODIMENTS

Figure 1A:
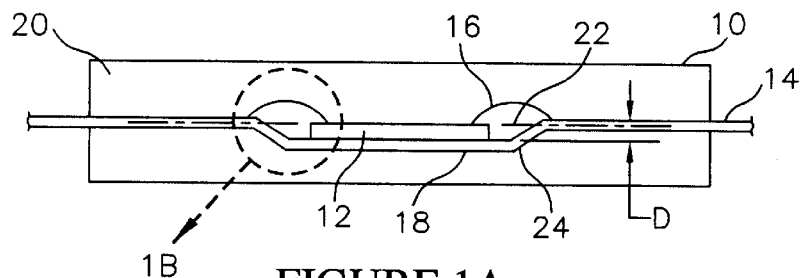
FIG. 1A is a schematic cross sectional view of a prior art semiconductor package constructed with a downset lead frame.
Figure 1B:
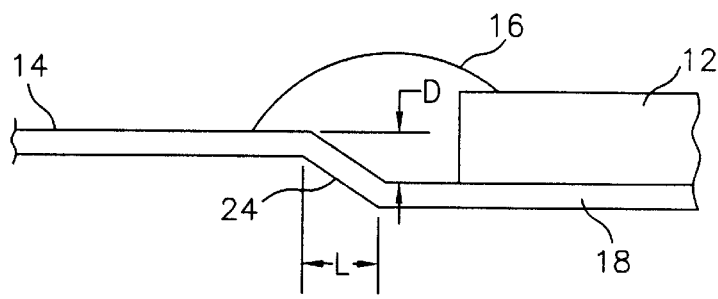
FIG. 1B is an enlarged portion of FIG. 1A with parts removed.
Figure 1C:
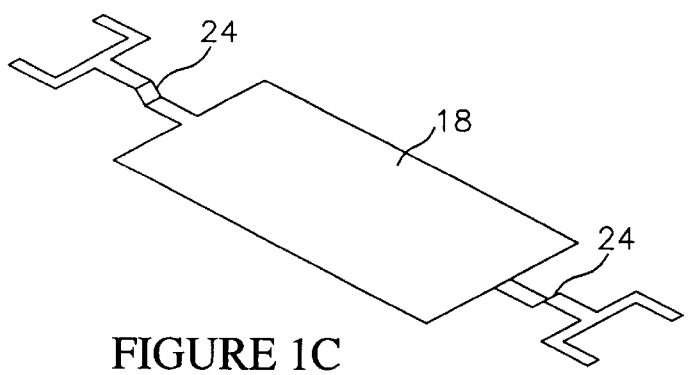
FIG. 1C is a perspective view of a prior art downset lead frame.
Figure 2:
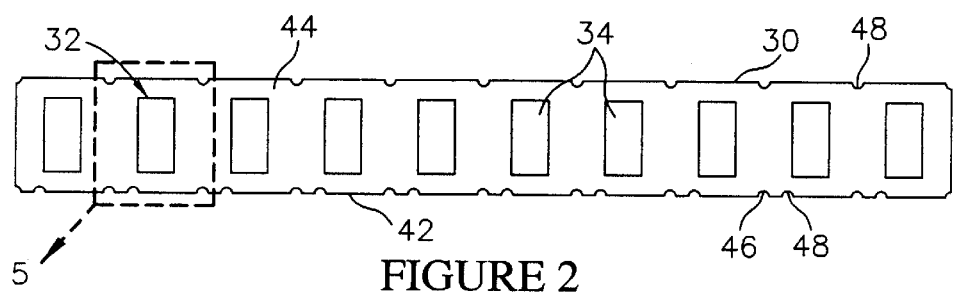
FIG. 2 is a plan view with parts removed of a downset lead frame constructed in accordance with the invention.

Referring to FIG. 2, a lead frame 30 constructed in accordance with the invention is illustrated. The lead frame 30 includes multiple die mounting sites 32. Each die mounting site 32 includes a die mounting paddle 34. The die mounting paddle 34 is also known in the art, as a chip support platform, or a die mount pad. In addition to the die mounting paddle 34, each die mounting site 32 also includes a pattern of lead fingers 40 (FIG. 5).

In an illustrative embodiment the lead frame 30 includes ten die mounting sites 32. However, this number is merely exemplary, and a greater or lesser number of die mounting sites 32 can be employed. Each die mounting site 32 can be used to encapsulate a semiconductor die 36 (FIG. 5) to form a semiconductor package 38 (FIG. 5).

The lead frame 30 also includes parallel spaced side rails 42, 44 having multiple through openings 46, 48. The side rails 42, 44 and openings 46, 48 permit the lead frame 30 to be handled by automated transfer mechanisms associated with chip bonders, wire bonders, molds, trim and form machinery, and marking machinery.

The lead frame 30 can be formed of metal using a stamping process, or a chemical milling process. Suitable metals for the lead frame 30 include nickel-iron alloys (e.g., 42% Ni–58% Fe), clad materials (e.g., copper clad stainless steel), or copper alloys.

Figure 3:
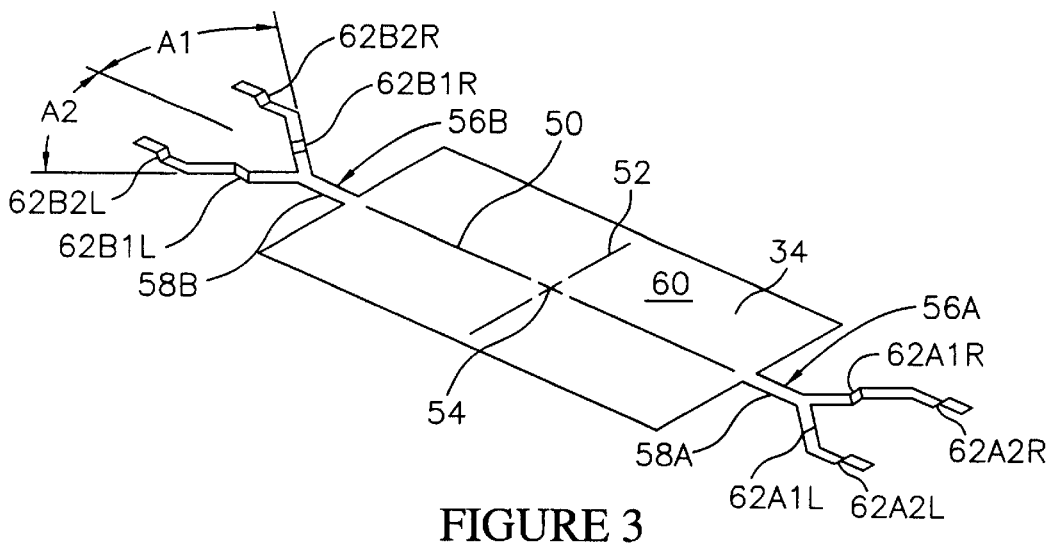
FIG. 3 is a perspective view of a lead frame mounting paddle constructed with multiple downset segments in accordance with a first embodiment of the invention.

Referring to FIG. 3, a single die mounting paddle 34 is illustrated separately from the lead frame 30. The die mounting paddle 34 includes a flat planar surface 60 configured to support the die 36. During a die attach process the backside of the die 36 will be adhesively bonded to the surface 60 of the die mounting paddle 34. Accordingly, the die mounting paddle 34 has a peripheral shape which corresponds to a peripheral shape of the die 36. In the illustrative embodiment the die mounting paddle 34 has a generally rectangular peripheral shape. However, the die mounting paddle 34 can also be configured in other peripheral shapes, such as square. A peripheral size of the die mounting paddle 34 can be slightly larger than a peripheral size of the die 36.

The die mounting paddle 34 has a longitudinal axis 50 and a lateral axis 52. With the die mounting paddle 34 being rectangular, the longitudinal axis is generally parallel to the long sides thereof. A center 54 of the die mounting paddle 34 is located at the point of intersection of the longitudinal axis 50 and the lateral axis 52.

The die mounting paddle 34 also includes a first support member 56A, and a second support member 56B. The support members 56A, 56B attach the die mounting paddle 34 to the side rails 42, 44 (FIG. 5) of the lead frame 30. The support members 56A, 56B include connecting segments 58A, 58B attached to the die mounting paddle 34. The connecting segments 58A, 58B are generally planar to the surface 60 of the die mounting paddle 34, and are oriented along the longitudinal axis 50 of the die mounting paddle 34.

Support member 56A includes a left side first downset segment 62A1L and a right first side downset segment 62A1R. In a similar manner, support member 56B includes a left side first downset segment 62B1L and a right side first downset segment 62B1R. The right side downset segments 62A1R, 62B1R are angled from the longitudinal axis by an angle A1. The left side downset segments 62A1L, 62B1L are angled from the longitudinal axis by an angle A2. The angles A1 and A2 are opposed to one another and generally equal to one another. A representative value for the angles A1 and A2 is from about 30° to 45°. The first downset segments (62A1L, 62A1R) (62B1L, 62B1R) provide a vertical, or z-direction, offset D1 (FIG. 5C) for the surface 60 of the die mounting paddle 34. A representative value for the vertical offset D1 is from 5 mils (0.127 mm) to 15 mils (0.381 mm).

Support member 56A also includes a left side second downset segment 62A2L and a second right side downset segment 62A2R. In a similar manner, support member 56B includes a left side second downset segment 62B2L and a right side second downset segment 62B2R. The second downset segments (62A2L, 62A2R) (62B2L, 62B2R) attach to the side rails 42,44 (FIG. 5) of the lead frame 30. In addition, the second downset segments (62A2L, 62A2R) (62B2L, 62B2R) are generally parallel to one another and generally parallel to the longitudinal axis 50 of the die mounting paddle 34. Still further, the second downset segments (62A2L, 62A2R) (62B2L, 62B2R) provide a vertical offset D2 (FIG. 5C) for the surface 60 of the die mounting paddle 34. A representative value for the offset D2 is from 5 mils (0.127 mm) to 15 mils (0.381 mm).

The multiple pairs of downset segments (62A1L, 62A1R) (62B1L, 62B1R) (62A2L, 62A2R) (62B2L, 62B2R) permit the vertical offset of the die mounting paddle 34 to be accomplished in increments. This improves the stackability of the lead frame 30 because adjacent lead frames 30 of a stack are less likely to stick together. In addition, the multiple pairs of downset segments (62A1L, 62A1R) (62B1L, 62B1R) (62A2L, 62A2R) (62B2L, 62B2R) improve the X direction, Y direction, and rotational orientation (i.e., planarity) of the die mounting paddle 34. This improves subsequent die attach, wire bonding and molding procedures. Still further, the multiple pairs of downset segments (62A1L, 62A1R) (62B1L, 62B1R) (62A2L, 62A2R) (62B2L, 62B2R) prevent work hardening of the metal which forms the lead frame 30, as can occur with large single downsets.

Figure 3A:
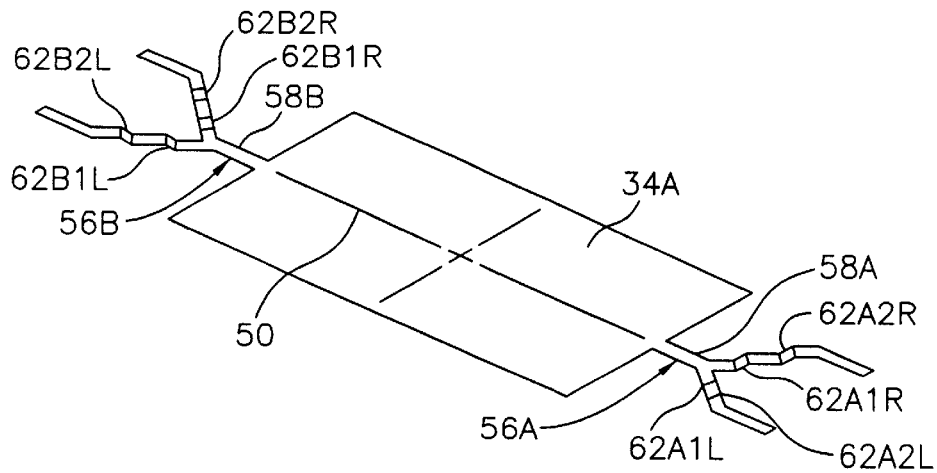
FIGS. 3A–3B are perspective views of lead frame mounting paddles constructed as different species of the embodiment of FIG. 3.

Referring to FIG. 3A, a species of the embodiment of FIG. 3 is illustrated. In FIG. 3A, a die mounting paddle 34A includes support members 56A, 56B formed with pairs of downset segments (62A1L, 62A1R) (62B1L, 62B1R) and pairs of second downset segments (62A2L, 62A2R) (62B2L, 62B2R), substantially as previously described. However, the pairs of second downset segments (62A2L, 62A2R) (62B2L, 62B2R) are at opposing angles to one another. In addition, the pairs of second downset segments (62A2L, 62A2R) (62B2L, 62B2R) are generally collinear to the pairs of first downset segments (62A1L, 62A1R) (62B1L, 62B1R).

Figure 3B:
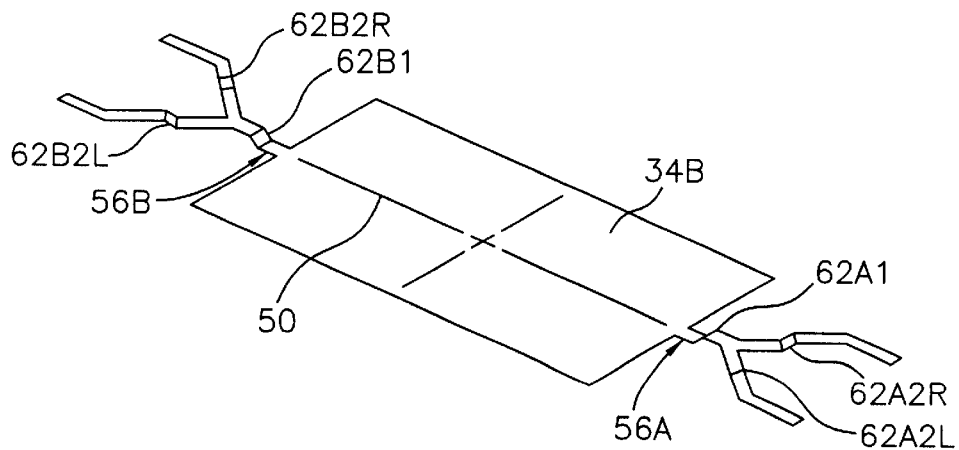

Referring to FIG. 3B, another species of the embodiment of FIG. 3 is illustrated. In FIG. 3B, a die mounting paddle 34B includes support members 56A, 56B, substantially as previously described. However, first downset segments 62A1, 62B1 are single segments rather than opposed pairs, and are generally planar to the longitudinal axis 50 of the die mounting paddle 34B. In addition, second downset segments (62A2L, 62A2R) (62B2L, 62B2R) are formed as opposing pairs substantially as previously described for pairs of first downset segments (62A1L, 62A1R) (62B1L, 62B1R) in FIG. 3.

Figure 4:
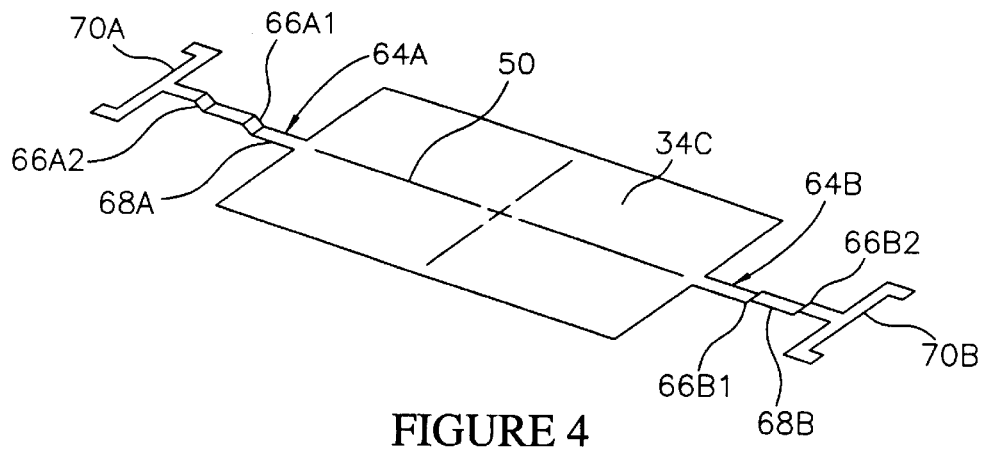
FIG. 4 is a perspective view of a lead frame mounting paddle constructed with multiple downset segments in accordance with a second embodiment of the invention.

Referring to FIG. 4, an alternate embodiment mounting paddle 34C is illustrated. This embodiment is characterized by at least one mating pair of generally collinear, or generally parallel, downset segments.

The mounting paddle 34C includes support members 64A, 64B formed on opposite lateral sides of the mounting paddle 34C. The support member 64A includes a connecting segment 68A. In addition, the support member 64A includes a first downset segment 66A1, and a second downset segment 66A2. The downset segments 66A1, 66A2 have axes that are generally collinear to one another, and generally planar to the longitudinal axis 50 of the mounting paddles 34C. The support member 64A also includes a bifurcated side rail connecting segment 70A attached to side rail 44 (FIG. 5) of the lead frame 30.

The support member 64B includes a connecting segment 68B. In addition, the support member 64B includes a first downset segment 66B1, and a second downset segment 66B2. The downset segments 66B1, 66B2 have axes that are generally collinear to one another, and generally planar to the longitudinal axis 50 of the mounting paddle 34C. The support member 64B also includes a bifurcated side rail connecting segment 70B attached to side rail 42 (FIG. 5) of the lead frame 30.

Figure 4A:
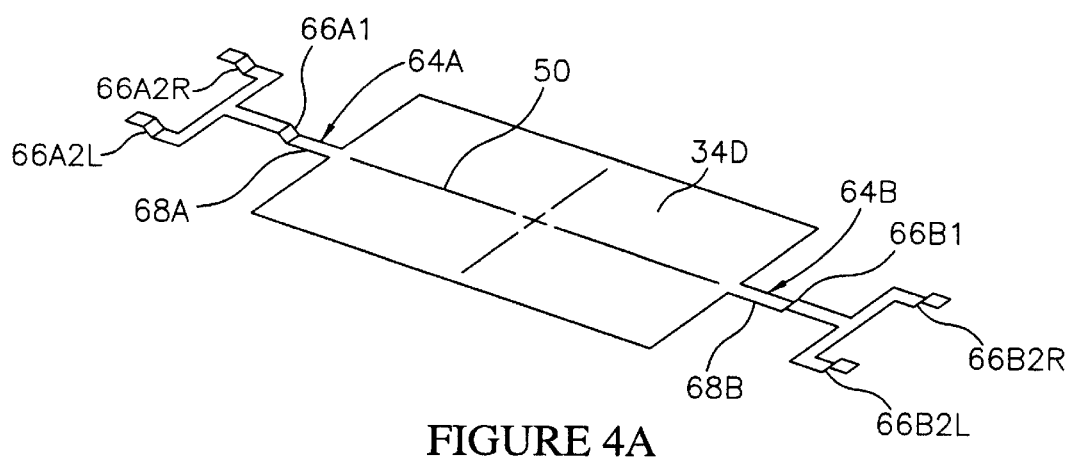
FIGS. 4A–4B are perspective views of lead frame mounting paddles constructed as different species of the embodiment of FIG. 4.

Referring to FIG. 4A, a species of the embodiment of FIG. 4 is illustrated. In FIG. 4A, a die mounting paddle 34D includes support members 64A, 64B, and first downset segments 66A1, 66B1 formed as previously described. In addition, the support member 64A includes a pair of second downset segments 66A2L, 66A2R that attach to side rail 44 (FIG. 5) of the lead frame 30. The second downset segments 66A2L, 66A2R are formed along axes that are generally parallel to one another and generally parallel to the longitudinal axis 50 of the lead frame 30. In a similar manner, the support member 64B includes a pair of second downset segments 66B2L, 66B2R that attach to side rail 42 (FIG. 5) of the lead frame 30. The second downset segments 66B2L, 66B2R are formed along axes that are generally parallel to one another and generally parallel to the longitudinal axis 50 of the lead frame 30.

Figure 4B:
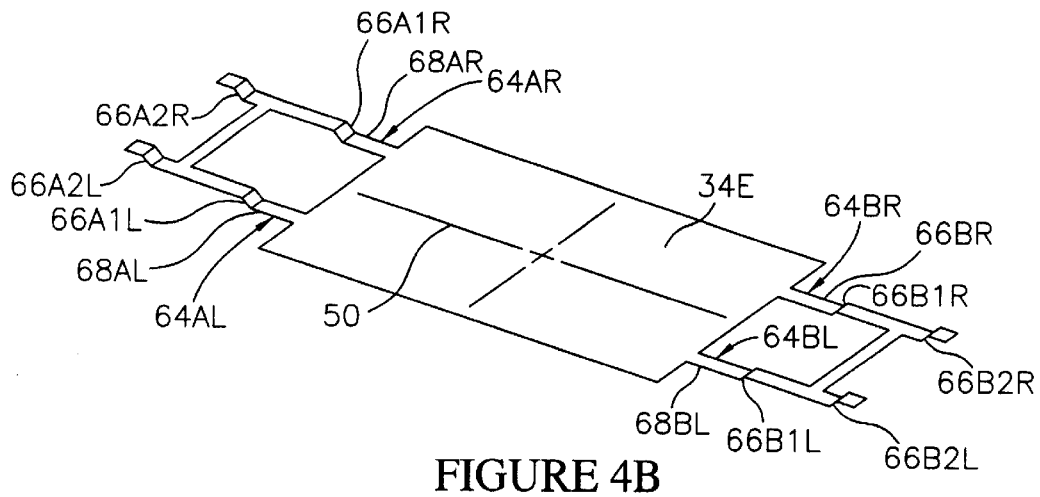

Referring to FIG. 4B, another species of the embodiment of FIG. 4 is illustrated. In FIG. 4B, a die mounting paddle 34E includes a left support member 64AL and a right support member 64AR on one side. The left support member 64AL is generally parallel to the right support member 64AR and to the longitudinal axis 50. The die mounting paddle 34E also includes a left support member 64BL and a right support member 64BR. The left support member 64BL is generally parallel to the right support member 64BR and to the longitudinal axis 50. Each support member 64AL, 64BL, 64AR, 64BR includes a connecting segment 68AL, 68BL, 68AR, 68BR. In addition, support member 64AL includes a first downset segment 66A1L and a second downset segment 66A2L. Support member 64AR includes a first downset segment 66A1R and a second downset segment 66A2L. Support member 64BL includes a first downset segment 66B1L and a second downset segment 66B2L. Support member 64BR includes a first downset segment 66B1R and a second downset segment 66B2R.

Referring to FIG. 5, a single die mounting site 32 of the lead frame 30 is illustrated. In addition, the peripheral outline of the package 38 formed on the die mounting site 32 is indicated by the outer dotted rectangle. In general, the package 38 can be formed using conventional processes including die attach, wire bonding, molding, trimming, and lead forming.

During a die attach process, the back side of the die 36 is adhesively bonded to the die mounting paddle 34 using an adhesive. Representative die attach adhesives include epoxy, silicone and polyimide adhesives. With the die 36 attached to the die mounting paddle 34, the bond pads 80 on the die 36 are exposed such that wires 82 are wire bonded to the bond pads 80, and to the lead fingers 40. The lead fingers 40 include tip portions 84 where the wires 82 are bonded. The tip portions 84 of the lead fingers 40 are spaced from but proximate to a periphery of the die 36. The tip portions 84 can be plated with a wire bondable material such as silver. In FIG. 5, the inner dotted rectangle 92 represents the plated area of the lead fingers 40.

The lead fingers 40 also include terminal portions 86 which will be trimmed and formed into the terminal leads for the package 38. The tip portions 84 and terminal portions 86 of the lead fingers 40 are joined together and stabilized by connecting segments 88. Following a transfer molding process in which a plastic body of the package 38 is formed, the connecting segments 88 between the lead fingers 40 are severed, such that each tip portion 84, and its associated terminal portion 86, forms a separate conductive path through the package 38 to the die 32. The lead frame 12 also includes through slots 90 which define the boundaries between each die mounting site 32. Following the molding process, the lead frame 30 can be severed in a transverse direction through the slots 90 to form a plurality of separate packages 38.

Referring to FIGS. 5A–5C, further details of the support member 56B for the die mounting paddle 34 are illustrated. As is apparent, the support member 56A, which is not shown in these figures, is substantially identical in construction to support member 56B.

As shown in FIG. 5A, the first downset segments 62B1L, 62B1R of the support member 56B provide a vertical offset of D1. As also shown in FIG. 5A, connecting segments 68C, which are generally parallel to the die mounting paddle 34, can be provided between the first downset segments 62B1R, 62B1L and the second downset segments 62B2R, 62B2L. Other connecting segments 68D, which are generally planar to the die mounting paddle 34, can be provided between first downset segments 62B1R, 62B1L and the connecting segment 58B.

As shown in FIG. 5C, a representative length L1 of the first downset segments 62B1L, 62B1R can be from 0.18 mm to 0.75 mm. A representative angle A3 of the first downset segments 62B1L, 62B1R measured from a plane of the connecting segments 68C, can be from 30° to 45°. With the first downset segments 62B1L, 62B1R being opposed to one another, as described above, the stability and planarity of the die mounting paddle 34 is improved. In addition, the location and rotational orientation of the die mounting paddle 34 can be more accurately maintained in a stack of lead frames 30.

As shown in FIG. 5B, the second downset segments 62B2L, 62B2R of the support member 56B provide a vertical offset of D2. A representative length L2 of the second downset segments 62B2L, 62B2R can be from 0.18 mm to 0.75 mm. A representative angle A4 of the second downset segments 62B2L, 62B2R, measured from a plane of the lead frame 30 can be from 30° to 45°.

In the completed package 38, a surface, or plane, of the die mounting paddle is offset from a surface, or plane, of the lead fingers 40 by a distance equal to D1 plus D2. This allows the lead fingers 40 to be located along a neutral axis of the package 38, which reduces thermal stresses between the lead fingers 40 and plastic body of the package 38. In addition, drag forces on the wire bonded wires 82 are reduced during the molding process.

Thus the invention provides an improved semiconductor lead frame having multiple downsets. In addition, an improved semiconductor package fabricated using the lead frame is provided. Even though the various lead frame embodiments described herein included first and second downset segments for providing downsets D1 and D2, it is to be understood that more than two downset segments (e.g., three, four, etc.) can also be provided to provide additional downsets.

Although the invention has been described with reference to certain preferred embodiments, as will be apparent to those skilled in the art, certain changes and modifications can be made without departing from the scope of the invention as defined by the following claims.

What is claimed is:

1. A semiconductor lead frame comprising:
   a pair of spaced side rails;
   a plurality of lead fingers between the side rails;
   a die mounting paddle having an axis, the paddle attached to the side rails proximate to the lead fingers; and
   a pair of support members on either side of the paddle configured to attach the paddle to the side rails, each support member comprising:
      a first downset segment oriented along a first axis generally parallel to the axis configured to offset the paddle from the lead fingers by a first distance, and
      a second downset segment attached to the first downset segment and oriented along the first axis, the second downset segment configured to offset the paddle from the lead fingers by a second distance.

2. The lead frame of claim 1 wherein the first distance is between about 5 mils to 15 mils.

3. The lead frame of claim 1 wherein the second distance is between about 5 mils to 15 mils.

4. The lead frame of claim 1 further comprising a connecting segment oriented generally planar to the paddle and attached to the paddle and to the first downset segment.

5. The lead frame of claim 1 wherein the first downset segment and the second downset segment are substantially collinear.

6. A semiconductor lead frame comprising:
   a pair of spaced side rails;
   a plurality of lead fingers between the side rails;
   a die mounting paddle having an axis, the paddle attached to the side rails proximate to the lead fingers; and
   a pair of generally parallel, spaced support members on either side of the paddle configured to attach the paddle to the side rails, each support member comprising:
      a connecting segment attached to the paddle and being generally planar to the paddle;
      a first downset segment attached to the connecting segment and oriented along a first axis generally parallel to the axis of the paddle, the first downset segment configured to offset the paddle from the lead fingers by a first distance, and
      a second downset segment attached and generally collinear to the first downset segment and oriented along the first axis, the second downset segment configured to offset the paddle from the lead fingers by a second distance.

7. The lead frame of claim 6 wherein the paddle is generally rectangular and the axis is generally parallel to a long side of the paddle.

8. The lead frame of claim 6 wherein the second distance is between about 5 mils to 14 mils.

9. The lead frame of claim 6 wherein the first distance is between about 5 mils to 14 mils.

10. The lead frame of claim 6 further comprising a second connecting segment between the first downset segment and the second downset segment generally parallel to the paddle.

11. A method for fabricating a semiconductor package comprising:
   providing a semiconductor die;
   providing a lead frame comprising:
      a pair of spaced side rails;
      a plurality of lead fingers between the side rails;
      a die mounting paddle having an axis, the paddle attached to the side rails proximate to the lead fingers; and
      a pair of support members on either side of the paddle configured to attach the paddle to the side rails, each support member comprising:
         a first downset segment oriented along a first axis generally parallel to the axis configured to offset the paddle from the lead fingers by a first distance, and
         a second downset segment attached to the first downset segment and oriented along the first axis, the second downset segment configured to offset the paddle from the lead fingers by a second distance;
   attaching the die to the paddle; and
   wire bonding the die to the lead fingers.

12. The method of claim 11 wherein the lead fingers are located along a neutral axis of the package.

13. The method of claim 11 further comprising following the wire bonding step, forming a plastic body on the lead frame.

14. The method of claim 11 wherein the first distance and the second distance are between about 5 mils to 15 mils.

15. A semiconductor package comprising:
   a lead frame comprising:
      a pair of spaced side rails;
      a plurality of lead fingers between the side rails;
      a die mounting paddle having an axis, the paddle attached to the side rails proximate to the lead fingers; and a pair of support members on either side of the paddle configured to attach the paddle to the side rails, each support member comprising:
  a first downset segment oriented along a first axis generally parallel to the axis configured to offset the paddle from the lead fingers by a first distance, and
  a second downset segment attached to the first downset segment and oriented along the first axis, the second downset segment configured to offset the paddle from the lead fingers by a second distance; and a semiconductor die attached to the paddle and wire bonded to the lead fingers.

16. The package of claim 15 wherein the lead fingers are oriented along a neutral axis of the package.

17. The package of claim 15 wherein the support members of the pair are generally parallel to one another.

18. The package of claim 15 wherein the first distance and the second distance are between about 5 mils to 15 mils.

* * * * *